United States Patent
Sakemi

(10) Patent No.: US 6,468,582 B1
(45) Date of Patent: Oct. 22, 2002

(54) METHOD OF SOLDER PRE-COATING AND SOLDER PRE-COATED CIRCUIT BOARD

(75) Inventor: Shoji Sakemi, Fukuoka (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/542,934

(22) Filed: Apr. 4, 2000

(30) Foreign Application Priority Data

Apr. 5, 1999 (JP) .......................................... 11-097314

(51) Int. Cl.$^7$ ................................................. B05D 5/12
(52) U.S. Cl. ..................... 427/96; 427/446; 427/526; 427/124; 427/282; 427/250; 427/383.1; 228/180.1; 204/192.1
(58) Field of Search ............................ 427/96, 98, 124, 427/307, 314, 318, 319, 372.2, 383.1, 404, 405, 180, 250, 446, 526, 531, 282; 204/192.1; 228/180.1; 148/22

(56) References Cited

U.S. PATENT DOCUMENTS

| | | | | |
|---|---|---|---|---|
| 5,556,023 A | * | 9/1996 | Kuramoto et al. | 228/248.1 |
| 5,750,271 A | * | 5/1998 | Kuramoto et al. | 428/624 |
| 5,928,440 A | * | 7/1999 | Kuramoto et al. | 148/24 |
| 5,982,629 A | * | 11/1999 | Shoji et al. | 361/760 |

FOREIGN PATENT DOCUMENTS

| | | | |
|---|---|---|---|
| JP | 7-7244 | | 1/1995 |
| JP | 07-94853 | * | 4/1995 |
| JP | 09-27498 | * | 1/1997 |

* cited by examiner

Primary Examiner—Brian K. Talbot
(74) Attorney, Agent, or Firm—Parkhurst & Wendel, L.L.P.

(57) ABSTRACT

The solder pre-coating method including cleaning by dry etching a surface of a gold film on a surface of an electrode formed on a circuit board by covering the surface of the circuit board with a template having an opening; adding tackiness on the surface of the electrode after cleaning by making a tackiness adding compound react with the electrode surface; attaching solder powder on the tackiness added electrode surface; and forming a solder pre-coat layer on the electrode surface by melting the solder powder by heating. Another solder pre-coating method of the present invention adds tackiness on a surface of a gold film on a surface of an electrode after forming a metal film containing one of copper or nickel on the surface of the gold film. According to the present invention, as it eliminates the need for masking work on each individual circuit board in pre-coating solder, a partially solder pre-coated circuit board can be obtained simply and at allow cost. Furthermore, the circuit board of the present invention can reduce, possible failure in the assembling process.

6 Claims, 4 Drawing Sheets

METHOD OF SOLDER PRE-COATING AND SOLDER PRE-COATED CIRCUIT BOARD

BACKGROUND OF THE INVENTION

1. Field of the Invention

The present invention relates to a method of solder pre-coating in forming a solder pre-coat layer on an electrode on a circuit board and to a solder pre-coated circuit board having an electrode pre-coated with solder.

2. Description of the Prior Art

As a method of previously coating solder on an electrode on a circuit board on which electronic components are to be mounted, one using a tackiness adding compound is well known (ref. Japanese Patent No. 2,592,757). This is a method in which a solder pre-coat layer is formed on an electrode by first adding tackiness on the surface of the electrode by making a tackiness adding compound react with the electrode consisting mainly of copper , followed by attaching solder powder on the tackiness added electrode, and melting the attached solder. This method permit one, and to form a solder pre-coat with a uniform thickness by supplying solder only on the electrode portion of the surface of a circuit board.

On the other hand, there is a case in which a solder pre-coat is partially formed (so-called partial solder pre-coat) only on a specific area of an electrode or on a specific electrode among many electrodes formed on a circuit board, for instance, a specific electrode to which metal bumps of electronic components are to be joined. In such a case, too, it is preferable to apply the above-described method of treatment with tackiness adding.

However, in order to form a solder pre-coat on a predetermined portion or an electrode only out of a plurality of electrodes by a solder pre-coating method using the prior art tackiness adding treatment, it was necessary to mask electrode portions other than the predetermined ones with a protective film and the like for each individual circuit board. Therefore, the prior art method caused an increase in the cost due to complication of the solder pre-coating process and the possibility of damaging reliability of the circuit board due to otherwise unnecessary protective film remaining in the product.

Furthermore, a new fact has been found through investigation and experiments by the present, inventor on the above-mentioned tackiness adding compound that sufficient tackiness could not be obtained by making the above-mentioned tackiness adding compound react with a gold film which has a high degree of surface cleanliness.

Now, therefore, it is an object of the present invention to provide a simple method of forming a solder pre-coat layer with which a high quality partial solder pre-coat layer can be formed.

SUMMARY OF THE INVENTION

The solder pre-coating method of the present invention includes:

dry etching a surface of a circuit board on which a plurality of electrodes having a gold film on its surface by covering the surface of the circuit board with a template having an opening, thereby cleaning the surface of the gold film other than predetermined portion of the electrodes;

adding tackiness on the surface of a predetermined portion of the electrode by making a tackiness, adding compound react with the surface of the electrode after cleaning;

attaching solder powder to the tackiness added electrode; and forming a solder pre-coat layer only on a predetermined portion of the electrode by melting the solder powder by heating.

Other solder pre-coating method of the present invention includes:

forming a metal film containing at least one of copper or nickel on a surface of a predetermined portion of an electrode by covering with a template having an opening a circuit board on which a plurality of electrodes having a gold film on their surfaces;

adding tackiness on the surface of the metal film by making a tackiness adding compound react with the electrode surface;

attaching solder powder to the tackiness added electrode; and forming a solder pre-coat only on the predetermined portion of the electrode by melting the solder powder by heating.

According to the present invention, among the plurality of electrodes covered with a gold film having a surface of relatively low degree of cleanliness, those electrode portions which should not be pre-coated with solder can be cleaned by dry etching and the impurities on the surface are removed. Consequently, the, tackiness adding compound reacts only with the electrode portions having much impurities and selectively adds tackiness only to those electrode portions. Partial solder pre-coating can be performed by subsequently attaching solder powder on the tackiness added electrode portions and melting the solder powder by heating.

DESCRIPTION OF THE PREFERRED EMBODIMENTS

Figure 1A:
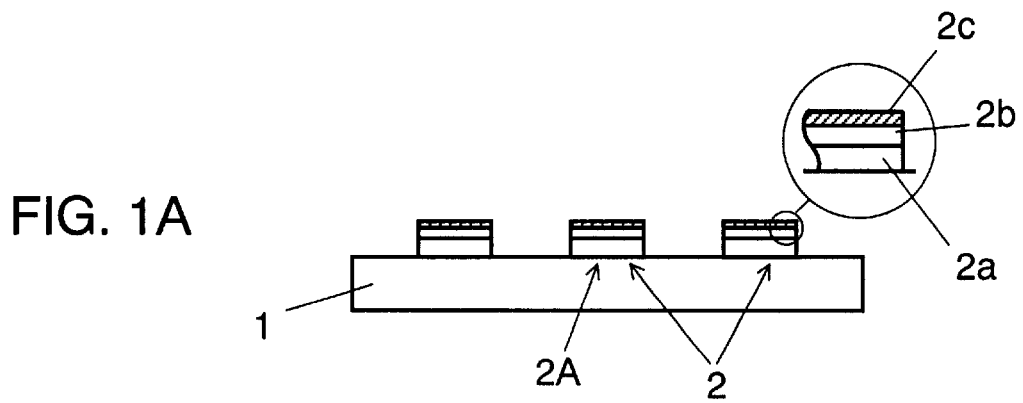
FIGS. 1A to 1D are process charts illustrating a method of manufacturing a solder pre-coating in the first exemplary embodiment of the present invention.

Referring to the drawings a description of exemplary embodiments of the present invention will be given in the following.

First Exemplary Embodiment

FIGS. 1A to 2D are process charts illustrating a method of manufacturing a solder pre-coating in the first exemplary embodiment of the present invention.

In FIG. 1A, a plurality of electrodes 2 is formed on the top surface of a circuit board 1. A thin film of gold 2b has been formed on the electrodes 2 by substitution type electroless gold plating on the surface of a copper electrode pattern 2a. Copper, nickel and the like which got mixed during the plating process are contained in the film 2b, and an oxide 2c (impurities) of these metals has been formed on the surface of the film 2b. Consequently, the degree of cleanliness of the surface of the film 2b is low. Among the plurality of electrodes 2, electrode 2A is the object electrode for solder pre-coating.

Figure 1B:
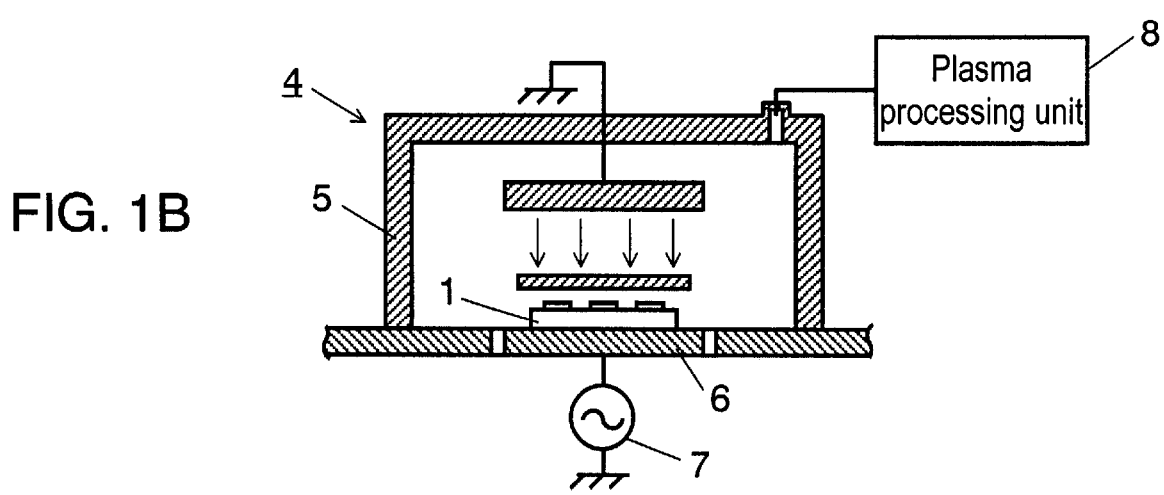
Figure 1C:
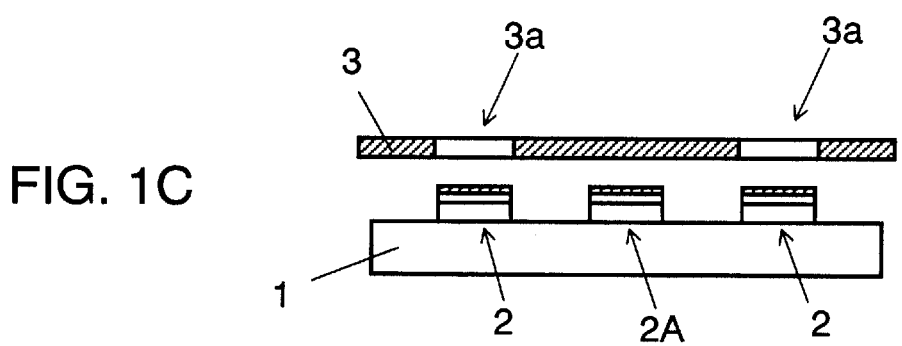

Next, as illustrated in FIG. 1B, the circuit board 1 is transferred to a cleaning process area, where it is placed on top of an electrode portion 6 inside a processing chamber 5 of a plasma processing apparatus 4, and processed with dry etching. In the processing chamber 5, a template 3 is so arranged that it will come above the circuit board 1. As illustrated in FIG. 1C, an opening 3a is formed on the template 3 corresponding to the portion and shape of the electrodes 2 other than the electrode 2A. As a result, under the condition where the circuit board 1 is placed and positioned on the electrode portion 6, the electrode 2A is covered with the template 3 while other electrodes 2 are exposed to the processing chamber 5 through the opening 3a.

Incidentally, though the distance between the circuit board 1 and the template 3 is exaggerated in FIG. 1C for illustration's sake, the actual gap is too small for plasma to get into the gap, thus allowing processing of the intended portion only.

Figure 1D:
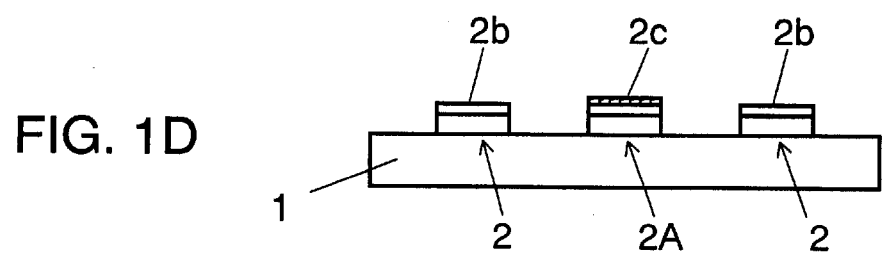

Subsequently, evacuation of the processing chamber 5 and supply of a gas for plasma generation are performed by a plasma processing unit 8 followed by application of a high frequency voltage to the electrode portion 6 from a power supply unit 7. Plasma is thus generated inside the processing chamber 5 causing bombardment of the top surface of the circuit board 1 by generated ions and electrons. As a result, the top surfaces of the exposed electrodes 2 of the circuit board 1 are cleaned by the bombardment of ions and electrons as illustrated in FIG. 1D thereby removing a compound 2c formed on the surface of the gold film 2b. On the other hand, no cleaning action by dry etching is performed on the electrode 2A of which the upward part has been covered with the template 3, and the compound 2c on the surface of the gold film 2b remains.

Next, a tackiness adding treatment is performed on the circuit board 1 which has been cleaned by a dry etching process. With this treatment, a tacky material is produced on the electrode surface either by coating a solution of a tackiness adding compound on the circuit board 1 or dipping the circuit board 1 into the solution thereof. Though the treatment process itself is the same as the above-described prior art, the inventor has discovered that, among the gold films, as a gold film has more impurities containing many compounds of copper, nickel, and the like on the surface, it becomes more possible to impart more stable tackiness. In other words, by making use of the difference in the reactivity against a tackiness adding compound on the surface of a gold film, it is possible to perform partial solder pre-coating without performing the costly and reliability damaging masking process.

In summary, while the tackiness adding compound used here easily reacts on the surface of a metal coating containing copper or nickel, it has a characteristic of not easily reacting on the surface of a gold film which has a higher degree of surface cleanliness.

As the tackiness adding compound, naphthotriazol, benztriazol, imidazol, benzimidazol, mercaptobenzthiazol, benzthiazol, and their derivatives as disclosed in Japanese Patent No. 2,592,757 can be used. Furthermore, in addition to these compounds, triazine-dithiole derivatives can also be used. By introducing various structures in the substitution group of the derivatives, a greater tackiness can be added.

Figure 2A:
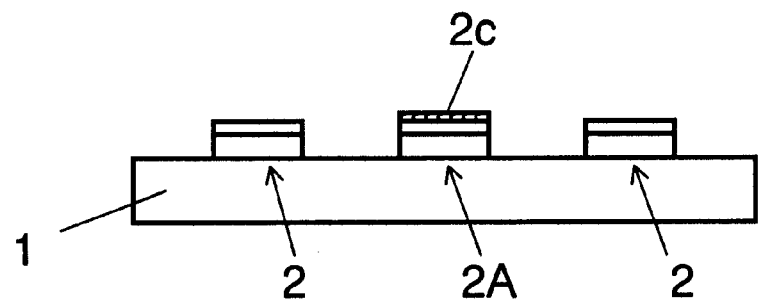
FIGS. 2A to 2D are process chart illustrating a method of manufacturing a solder pre-coating in the first exemplary embodiment of the present invention.

In this way, tackiness can be selectively added only to the electrode 2A out of the electrodes 2 of FIG. 2A.

Figure 2B:
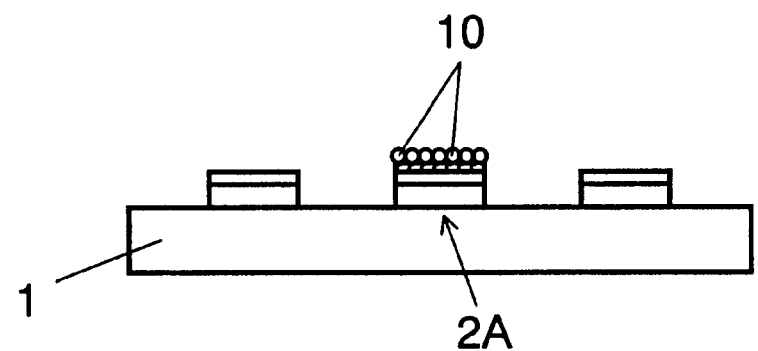

Next, by sprinkling solder powder 10 on the top surface of the circuit board 1 after cleaning and removing the tackiness adding compound attached to the circuit board 1, the solder powder will attach to the tackiness added electrode 2A as illustrated in FIG. 2B. By subsequently removing extra solder powder, the solder powder can only be attached to the electrode 2A.

Figure 2C:
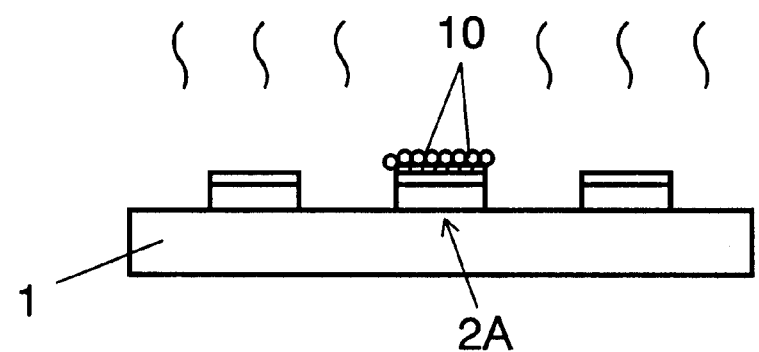
Figure 2D:
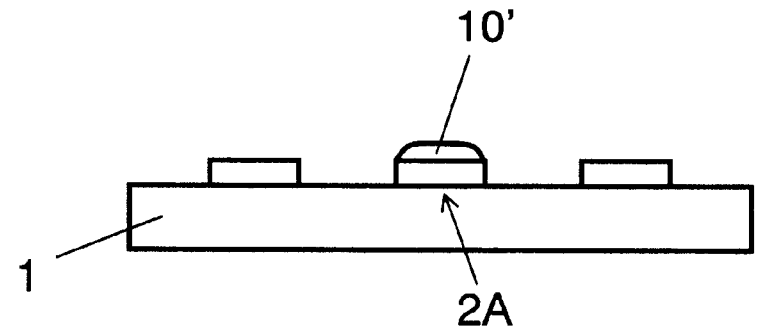

The circuit board 1 is then transferred to a reflow process, where it is heated, after being supplied with a flux if necessary, to the melting temperature of the solder or higher temperature as illustrated in FIG. 2C, and the solder powder 10 attached to the electrode 2A is melted. Thus, the molten solder deposits on the electrode 2A forming a solder pre-coat layer 10' thus completing a solder pre-coated circuit board on which a solder pre-coat has been formed selectively only on the predetermined electrode 2A.

Prior to performing dry etching, it is preferable to make heat treatment on the circuit board having electrodes 2 on which a gold film 2b has been formed as illustrated in FIG. 1A. By heat treatment, the impurities such as copper and nickel in the vicinity of the surface of the gold film 2b migrate to the surface of the gold film 2b, oxidized by the atmosphere, thus promoting formation of the compound 2c while the gold film 2b which is positioned deeper than the compound 2c becomes a gold layer containing higher purity gold.

Temperature of the above heat treatment is preferably higher within the range in which the materials of the circuit board 1 do not deteriorate. Though migration of gold atoms takes place at room temperature, the length of time of heat treatment can be shortened at a temperature higher than room temperature. Usually, in the case of resin materials employed as the circuit board material, the upper limit of treatment temperature is 250 degrees Centigrade. However, when a ceramic circuit board is used, the treatment temperature can be made further higher.

Consequently, after cleaning by plasma processing, the contrast of the difference between the surface composition (cleanliness) of the electrode 2A where a compound 2c of copper, nickel and the like remains and other electrodes 2 where a compound 2c has been removed and higher purity gold layer is exposing becomes more prominent. Therefore, by performing heat treatment in advance, it is possible to make the selectivity surer in adding tackiness only to the predetermined electrodes.

Also, in addition to the advantage of having a smaller dispersion of solder pre-coat thickness, the circuit board fabricated according to the present method is featured with increased cleanliness of the surface and purity of the gold film due to plasma cleaning of the electrodes not precoated with solder. As a result, this method provides an advantage of superior solderability and bonding ability in the subsequent assembling process, leading to less opportunity of failure. Furthermore, as the gold plating in this exemplary embodiment employs substitution type electroless plating, this method gives an added merit of being able to make the manufacturing cost of circuit boards lower.

Second Exemplary Embodiment

Referring to FIGS. 3 and 4, a second exemplary embodiment of the present invention will be described in the following.

FIGS. 3A to 4D are process charts illustrating a method of solder pre-coating in the second exemplary embodiment.

Figure 3A:
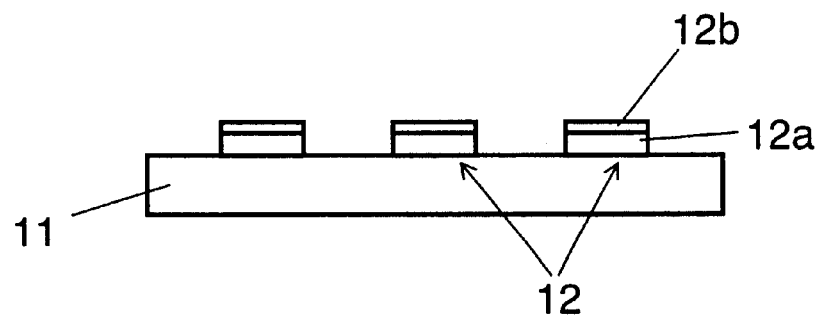
FIGS. 3A to 3C are process charts illustrating a method of manufacturing a solder pre-coating in the second exemplary embodiment of the present invention.

In FIG. 3A, a plurality of electrodes 12 are formed on a top surface a circuit board 11. A thick film of gold 12b has been formed on a copper electrode pattern 12a of the electrodes 12 by thick gold plating such as electrolytic gold plating or reduction type electroless gold plating. As such thick gold plating provides higher cleanliness of the surface compared with the aforementioned substitution type electroless gold plating, it is not possible to produce a tacky material even by reaction with a tackiness adding compound. Out of the plurality of electrodes 12, an electrode 12A is the object electrode for forming a solder pre-coat.

Figure 3B:
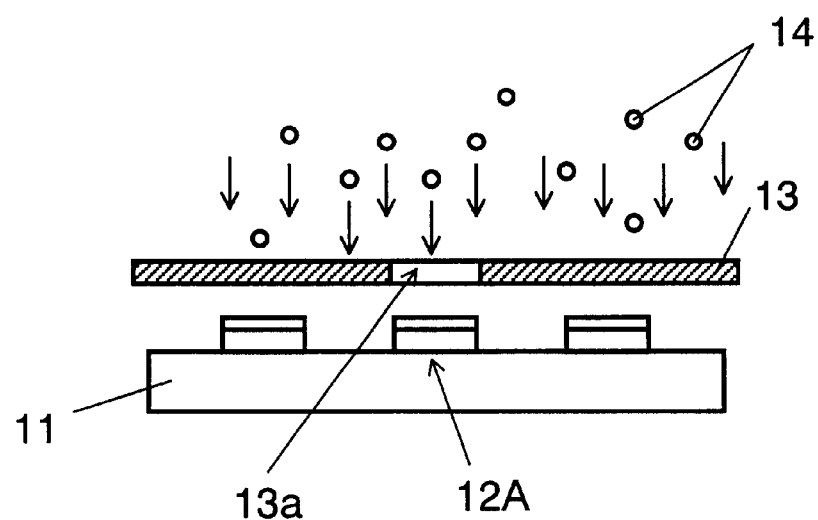

Next, as illustrated in FIG. 3B, sputtering is performed with a template 13 arranged above the circuit board 11. An opening 13a is provided on the template 13 corresponding to the portion and shape of the electrode 12A. Consequently, in a state in which the circuit board 11 is positioned relative to the template 13, only the electrode 12A is exposed upwardly via the opening 13a while upward parts of the other electrodes 12 are covered by the template 13.

Figure 3C:
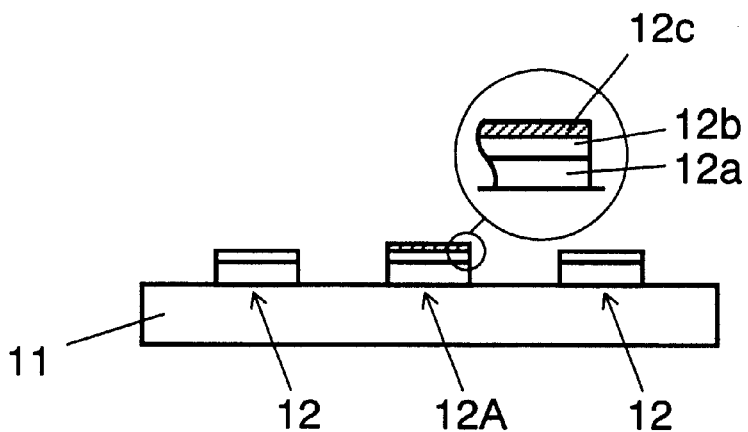

In the sputtering process, by bombarding the top surface of the circuit board 11 with a metal 14 containing copper or nickel in a vacuum, a metal film containing at least one of copper or nickel is formed on the bombarded surface. Through this process, a metal coat containing copper or nickel can be formed only on the surface of the gold film 12b of the electrode 12A as illustrated in FIG. 3C. Upon reaction with oxygen and the like in the air, the metal film forms a compound 12c such as an oxide film. As the film forming process other than the sputtering process, vacuum film formation methods such as vacuum deposition and ion plating, and film formation method to be performed in the air such as metal spraying method can also be used. Also, as with the first exemplary embodiment, the distance between the circuit board 11 and the template 13 is exaggerated in FIG. 3B.

Next, tackiness adding treatment is performed on the sputter-processed circuit board 11. This treatment is performed in the same manner as in the first exemplary embodiment.

Figure 4A:
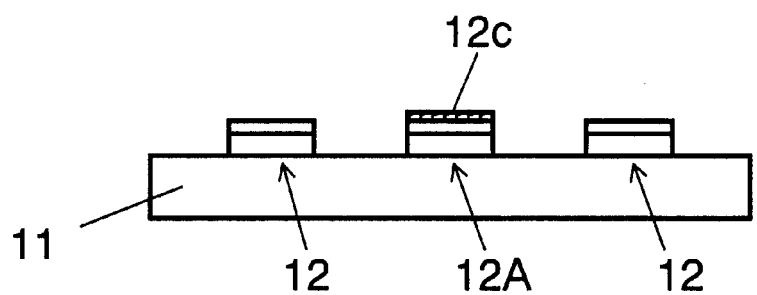
FIGS. 4A to 4D are process charts illustrating a method of manufacturing a solder pre-coating in the second exemplary embodiment of the present invention.

By performing the tackiness adding treatment on the circuit board 11 after the above plasma processing, it is possible to selectively add tackiness only on the electrode 12A having a copper or nickel containing compound 12c among the electrodes 12 on the circuit board 11 as illustrated in FIG. 4A.

Figure 4B:
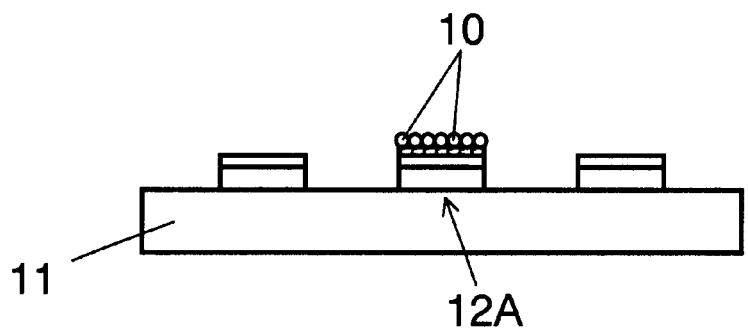

Then, by sprinkling solder powder 10 on the upper surface of the circuit board 11 after cleaning and removing tackiness adding compound attached to the circuit board 11, the solder, powder attaches to the tackiness added electrode 12A as illustrated in FIG. 4B. Subsequently, by removing extra solder powder, solder powder can be made to attach only on the electrode 12A.

Figure 4C:
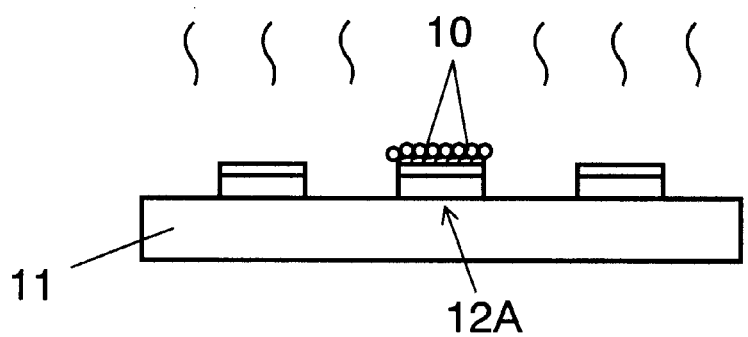
Figure 4D:
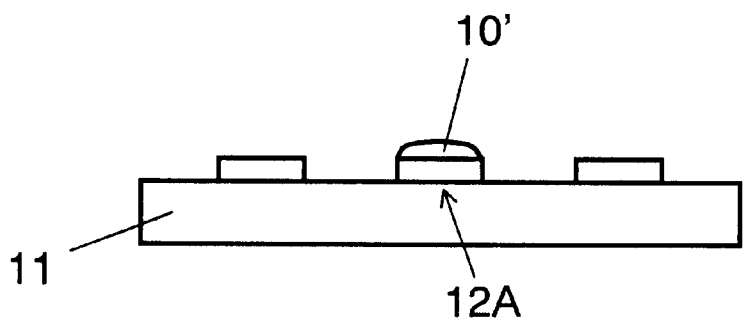

Next, the circuit board 11 is transferred to a reflow process, where it is heated, after a flux has been supplied if needed, to the melting temperature of the solder or a higher temperature as illustrated in FIG. 4C, and the solder powder 10 attaching to the electrode 12A melts. Thus, the molten solder welds to the electrode 12A, a solder pre-coat layer 10' is formed, and a solder pre-coated circuit board of which only the electrode 12A has been selectively pre-coated with solder is completed.

As has been described above, in pre-coating an electrode processed with tackiness adding treatment on a gold-plated electrode, the present invention makes it possible to, selectively pre-coat a predetermined electrode or a predetermined electrode portion only. In other words, without doing any masking work on the circuit board 1 that is required in selectively making a partial pre-coat in the prior art, tackiness can be selectively added to a gold film by plasma processing or and impurity-layer forming process depending on the type of gold, plating employed. As a result, it is possible to form a high quality partial solder pre-coat by taking advantage of a solder pre-coating method based on simple tackiness adding treatment.

Also, the circuit board fabricated by the present method has an advantage of having little dispersion of thickness of the pre-coated solder. Furthermore, as the electrodes not pre-coated with solder are coated with gold plating having a high degree of cleanliness, the circuit board has the advantage of being superior in solderability and bonding ability in the subsequent assembling process thus minimizing possible failure.

As has been described above, the present invention eliminates the need for masking work on each individual circuit board and can provide partial solder pre-coats with ease and at a low cost. Furthermore, it can provide a partial solder pre-coat which has lower possibility of causing a failure in the assembling process.

What is claimed is:

1. A solder pre-coating method comprising:

providing a circuit board having on its surface a plurality of electrodes, the electrodes having on their surfaces a gold film, said gold film having on its surface an oxide layer of metals included during a gold plating process;

covering the surface of said circuit board with a template having an opening or openings corresponding to some but not all of said plurality of electrodes;

dry etching a surface of a gold film on an electrode or electrodes that correspond to the opening or openings in said template to remove said oxide layer of metals on the gold film;

removing said template;

imparting tackiness to a surface of non-cleaned electrode or electrodes by means of a chemical reaction between the surface of the electrode or electrodes and a tackiness imparting compound;

attaching solder powder on the surface of the electrode or electrodes having tackiness imparted thereto; and forming a solder pre-coat layer on the surface of the electrode or electrodes by melting said solder powder by heating.

2. A solder pre-coating method comprising:

providing a circuit board having on its surface a plurality of electrodes, the electrodes having on their surfaces a gold film;

covering the surface of said circuit board with a template having an opening or openings corresponding to some but not all of said plurality of electrodes;

forming a metal film on the gold film on said some but not all of said plurality of electrodes corresponding to the opening or the openings by one of sputtering, vacuum deposition, ion plating and metal spraying;

removing said template;

heat treating said circuit board to oxidize said metal film on the gold film;

imparting tackiness to a surface of said metal film by means of a chemical reaction between the surface of the electrode or electrodes and a tackiness imparting compound;

attaching solder powder on the surface of the electrode or electrodes having tackiness imparted thereto; and forming a solder pre-coat layer on the surface of the electrode or electrodes by melting said solder powder by heating.

3. The solder pre-coating method of claim 1, wherein the method further comprises a step of heat treating said circuit board prior to said cleaning.

4. The solder pre-coating method of claim 1, wherein said gold film is formed by a substitution plating method.

5. The solder pre-coating method of claim 2, wherein the process further comprises a step of heat treating said circuit board prior to said imparting tackiness.

6. The solder pre-coating method of claim 2, wherein the step of forming said metal film is performed by sputtering, vacuum deposition, or metal spraying.

* * * * *